(12) United States Patent
Chen et al.

(10) Patent No.: US 7,777,179 B2
(45) Date of Patent: Aug. 17, 2010

(54) TWO-GRID ION ENERGY ANALYZER AND METHODS OF MANUFACTURING AND OPERATING

(75) Inventors: Lee Chen, Cedar Creek, TX (US); Lin Xu, Houston, TX (US); Ronald Victor Bravenec, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 205 days.

(21) Appl. No.: 12/059,983

(22) Filed: Mar. 31, 2008

(65) Prior Publication Data

US 2009/0242791 A1    Oct. 1, 2009

(51) Int. Cl.
*H01J 37/04* (2006.01)
*H01J 49/00* (2006.01)
*H01J 3/26* (2006.01)

(52) U.S. Cl. .................. 250/281; 250/282; 250/397; 324/466

(58) Field of Classification Search ............... 250/281, 250/282, 283, 305, 309, 356.1, 397, 492.1, 250/492.3; 324/464, 466, 667, 678
See application file for complete search history.

(56) References Cited

U.S. PATENT DOCUMENTS

| | | | |
|---|---|---|---|
| 5,160,840 A * | 11/1992 | Vestal | 250/287 |
| 5,451,784 A * | 9/1995 | Loewenhardt et al. | 250/305 |
| 5,565,681 A * | 10/1996 | Loewenhardt et al. | 250/305 |
| 5,989,349 A | 11/1999 | Ke et al. | |
| 6,326,794 B1 | 12/2001 | Lundquist et al. | |
| 6,653,852 B1 | 11/2003 | Benjamin | |
| 6,781,393 B2 | 8/2004 | Benjamin | |
| 6,972,579 B2 | 12/2005 | Benjamin | |
| 2005/0115673 A1 | 6/2005 | Samukawa et al. | |
| 2006/0037701 A1* | 2/2006 | Koshiishi et al. | 156/345.44 |
| 2006/0043063 A1 | 3/2006 | Mahoney et al. | |
| 2006/0214593 A1 | 9/2006 | Denpoh | |
| 2007/0029473 A1* | 2/2007 | Verentchikov | 250/281 |
| 2008/0017792 A1* | 1/2008 | Enke et al. | 250/287 |

(Continued)

FOREIGN PATENT DOCUMENTS

JP    08111297 A    4/1996

(Continued)

OTHER PUBLICATIONS

Gahan et al., Retarding field analyzer for ion energy distribution measurements at a radio-frequency biased electrode, Review of Scientific Instruments, 79, 033502-1-9, 2008.

*Primary Examiner*—Bernard E Souw

(57) ABSTRACT

An ion energy analyzer is described for use in diagnosing the ion energy distribution (IED) of ions incident on a radio frequency (RF) biased substrate immersed in plasma. The ion energy analyzer comprises an entrance grid exposed to the plasma, an electron rejection grid disposed proximate to the entrance grid, and an ion current collector disposed proximate to the electron rejection grid. The ion current collector is coupled to an ion selection voltage source configured to positively bias the ion current collector by an ion selection voltage, and the electron rejection grid is coupled to an electron rejection voltage source configured to negatively bias the electron rejection grid by an electron rejection voltage. Furthermore, an ion current meter is coupled to the ion current collector to measure the ion current.

18 Claims, 10 Drawing Sheets

U.S. PATENT DOCUMENTS

| | | | |
|---|---|---|---|
| 2008/0032427 A1* | 2/2008 | Lee et al. | 438/9 |
| 2008/0251206 A1* | 10/2008 | Nishio | 156/345.24 |
| 2009/0242790 A1* | 10/2009 | Chen et al. | 250/397 |
| 2009/0242791 A1* | 10/2009 | Chen et al. | 250/397 |

FOREIGN PATENT DOCUMENTS

| | | |
|---|---|---|
| JP | 2000208295 A | 7/2000 |
| JP | 2004235090 A | 8/2004 |

* cited by examiner

TWO-GRID ION ENERGY ANALYZER AND METHODS OF MANUFACTURING AND OPERATING

CROSS-REFERENCE TO RELATED APPLICATIONS

This application is related to co-pending U.S. patent application Ser. No. 12/059,855, entitled "ION ENERGY ANALYZER AND METHODS OF MANUFACTURING AND OPERATING", filed on even date herewith. The entire content of this application is herein incorporated by reference in its entirety.

BACKGROUND OF THE INVENTION

1. Field of the Invention

The invention relates to an ion energy analyzer and a method for making and using the ion energy analyzer and, more particularly, to an ion energy analyzer for measuring ion energy distribution (IED) in a plasma processing system.

2. Description of Related Art

Plasma, or more generally an electrical discharge, has found extensive use in a variety of industrial applications, including material processing. For example, during semiconductor processing, plasma is often utilized to assist etch processes by facilitating the anisotropic removal of material along fine lines or within vias (or contacts) patterned on a semiconductor substrate. Examples of such plasma assisted etching include reactive ion etching (RIE), which is in essence an ion activated chemical etching process.

During plasma processing, ion energy, and more specifically the ion energy distribution (IED), is a process parameter that strongly influences the outcome of the reactive process at the substrate. For example, when performing an etching process on a semiconductor device, ion energy affects etch selectivity, etch rate uniformity, sidewall profile, residue control, etc. Due to the significance of this process parameter, the measurement of ion energy at a specific location within a plasma processing system is important for characterizing the effectiveness of the plasma state for processing the substrate.

In general, the IED is measured in plasma by immersing a grid and an ion collector in a beam of ions. The electric potential of the grid is varied, and only the ions in the beam of ions having sufficient energy to overcome the potential barrier imposed by the grid will pass through the grid and strike the ion collector. By collecting and measuring the ion current as a function of the potential on the grid, an integrated form of the IED can be acquired. Differentiation of this integral leads to the IED.

Although the IED has been measured extensively in plasma processes for decades using a variety of ion energy analyzers, most conventional analyzers suffer from a multitude of problems including, but not limited to: (1) Conventional analyzers perturb the processing plasma to an extent that the measurement is no longer characteristic of the conditions prevailing when processing a substrate; (2) Conventional analyzers fail to operate at large electric potentials; and (3) Conventional analyzers exhibit substantive noise arising from secondary electron emission within the analyzer.

While many attempts have been made to cure these shortcomings, they still remain and the plasma processing community continues to explore novel, practical solutions to these and other problems.

SUMMARY OF THE INVENTION

The invention relates to an ion energy analyzer and a method for making and using the ion energy analyzer and, more particularly, to an ion energy analyzer for measuring ion energy distribution function (IED) in a plasma processing system.

The invention further relates to an ion energy analyzer for use in diagnosing the ion energy distribution (IED) of ions incident on a radio frequency (RF) biased substrate immersed in plasma. The ion energy analyzer may be fabricated on a substrate, such as a silicon substrate, and placed on a RF powered electrode or substrate holder in a plasma processing system, thus, enabling in-situ measurement of the IED. The ion energy analyzer may be electrically floating on the RF voltage coupled to the RF powered electrode or substrate holder, wherein the ion energy analyzer may be designed to have high capacitance to the RF powered electrode or substrate holder.

According to one embodiment, an ion energy analyzer for use in diagnosing the ion energy distribution (IED) of plasma is described. The ion energy analyzer comprises: an entrance grid exposed to the plasma at a reference voltage; an electron rejection grid disposed proximate to the entrance grid, wherein the electron rejection grid is coupled to an electron rejection voltage source configured to negatively bias the electron rejection grid at an electron rejection voltage; an ion current collector disposed proximate to the electron rejection grid, wherein the ion current collector is coupled to an ion selection voltage source configured to positively bias the ion current collector at an ion selection voltage; and an ion current meter coupled to the ion current collector and configured to provide a signal related to the selected ion current.

According to another embodiment, an ion energy analyzer for use in diagnosing the ion energy distribution (IED) of plasma is described. The ion energy analyzer comprises: a substrate; a first insulator disposed on the substrate; an ion current collector disposed on the first insulator; a second insulator disposed on the ion current collector, the second insulator having an aperture formed there through to expose a collection area on the ion current collector; a first conductive electrode disposed on the second insulator, the first conductive electrode having the aperture formed there through and aligned with the aperture in the second insulator; an electron rejection grid disposed on the first conductive electrode and extending over the aperture; a third insulator disposed on the first conductive electrode, the third insulator having the aperture formed there through and aligned with the aperture in the first conductive electrode; a second conductive electrode disposed on the fourth insulator, the third conductive electrode having the aperture formed there through and aligned with the aperture in the fourth insulator; an entrance grid disposed on the second conductive electrode and extending over the aperture; wherein the second conductive electrode is configured to develop a DC self-bias voltage in the plasma, wherein the first conductive electrode is configured to be coupled to a negative DC voltage referenced to the DC self-bias voltage on the second conductive electrode, wherein the ion current collector is configured to be coupled to a positive DC voltage referenced to the DC self-bias voltage on the second conductive electrode, wherein a selected ion current received at the ion current collector is configured to be measured by an ion current meter, and wherein the aperture permits the selected ion current to flow from the plasma to the ion current collector.

According to yet another embodiment, a method of measuring IED of plasma at one or more locations in a plasma processing system is described, comprising: placing one or more ion energy analyzers at the one or more locations on a substrate holder in a plasma processing system; and measuring an IED at each of the one or more locations by performing the following: exposing an entrance grid to the plasma at a DC self-bias potential; biasing an electron rejection grid proximate to the entrance grid by a negative DC voltage to reject electrons from the plasma; biasing an ion current collector proximate to the electron rejection grid by a positive DC voltage to discriminate between ions reaching the ion current collector; measuring an ion current at the ion current collector using a current meter; storing the ion current as a function of the positive DC voltage on the ion current collector; and varying the positive DC voltage on the ion current collector.

DETAILED DESCRIPTION OF EXEMPLARY EMBODIMENTS

In the following description, to facilitate a thorough understanding of the invention and for purposes of explanation and not limitation, specific details are set forth, such as a particular geometry of the plasma processing system and various descriptions of the system components. However, it should be understood that the invention may be practiced with other embodiments that depart from these specific details.

Nonetheless, it should be appreciated that, contained within the description are features which, notwithstanding the inventive nature of the general concepts being explained, are also of an inventive nature.

Figure 1:
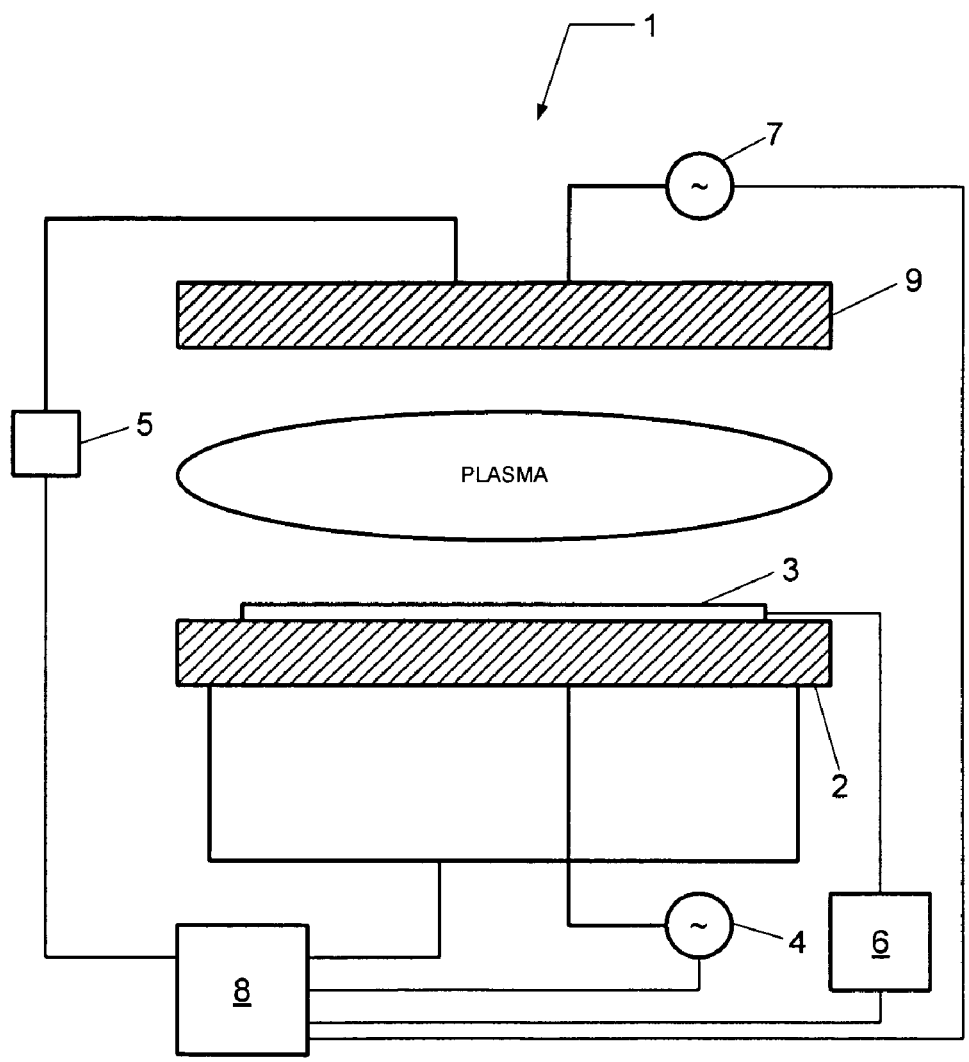
FIG. 1 illustrates a plasma processing system according to an embodiment.

Referring now to the drawings, wherein like reference numerals designate identical or corresponding parts throughout the several views, FIG. 1 depicts a simplified schematic of a plasma processing system 1 according to an embodiment. The plasma processing system 1 comprises a first electrode 2 and a second electrode 9 disposed opposite each other within a process chamber, wherein the first electrode 2 is a substrate holder configured to support a diagnostic substrate 3 (or a production substrate).

The first electrode 2 may be coupled to a first radio frequency (RF) power system 4 configured to provide RF power at a first RF frequency and a first RF voltage, while the second electrode 9 may be coupled to a second RF power system 7 configured to provide RF power at a second RF frequency and a second RF voltage. For example, the second RF frequency can be at a relatively higher RF frequency than the first RF frequency. The coupling of RF power to the first and second electrodes facilitates the formation of plasma in the space between the two electrodes.

Although both the first electrode 2 and the second electrode 9 are shown to be coupled to a RF power system, one of the electrodes may not be coupled to a RF power system. For example, the first electrode 2 may be coupled to RF power from RF power system 4 and the second electrode 9 may be coupled to direct current (DC) ground or a DC voltage. Alternatively, the first electrode 2 may be coupled to DC ground or a DC voltage and the second electrode 9 may be coupled to RF power from RF power system 7. Alternatively yet, the first electrode 2 may be coupled to RF power at multiple RF frequencies (e.g., the first RF frequency and the second RF frequency) from RF power system 4 and the second electrode 9 may be coupled to DC ground or a DC voltage.

Additionally, plasma processing system 1 optionally comprises a DC power system 5 configured to provide a DC voltage to the second electrode 9. The DC power system 5 may include a variable DC power supply. Additionally, the DC power system 5 may include a bipolar DC power supply. Furthermore, the DC power system 5 may include a system configured to perform at least one of monitoring, adjusting, or controlling the polarity, current, voltage, or on/off state. Once plasma is formed, the DC power system 5 can facilitate the formation of a high energy electron beam. An electrical filter may be utilized to de-couple RF power from the DC power system 5.

For example, the DC voltage applied to the second electrode 9 by DC power system 5 may range from approximately −2000 volts (V) to approximately 1000 V. Desirably, the absolute value of the DC voltage has a value equal to or greater than approximately 100 V, and more desirably, the absolute value of the DC voltage has a value equal to or greater than approximately 500 V. Additionally, it is desirable that the DC voltage has a negative polarity. Furthermore, it is desirable that the DC voltage is a negative voltage having an absolute value greater than the self-bias voltage generated on a surface of the second electrode 9. The surface of the second electrode 9 facing the first electrode 2 may be comprised of a silicon-containing material.

Here, the coupling of a DC voltage, such as a negative DC voltage, to the second electrode 9 can facilitate the formation of a ballistic electron beam as described above. The electron beam power is derived from the superposition of the negative DC voltage on the second electrode 9. As is described in published US patent application no. 2006/0037701A1, the application of negative DC power to the plasma processing system affects the formation of a ballistic (or collision-less) electron beam that strikes the surface of diagnostic substrate 3.

Plasma processing system 1 further includes diagnostic substrate 3 having one or more ion energy analyzers for use in diagnosing the ion energy distribution (IED) of ions incident on the diagnostic substrate 3 that is immersed in plasma and RF biased through the first electrode 2 by first RF power system 4. Each of the one or more ion energy analyzers may be fabricated on the diagnostic substrate 3, such as a silicon substrate, and placed on the first electrode 2 (i.e., a RF powered electrode or substrate holder) in the plasma processing system 1, thus, enabling in-situ measurement of the IED. Each of the one or more ion energy analyzers may be electrically floating on the RF voltage coupled to the first electrode 2 (i.e., the RF powered electrode or substrate holder), wherein each of the one or more ion energy analyzers may be designed to have high capacitance to the first electrode 2.

Referring still to FIG. 1, a measurement electronics system 6 is coupled to the one or more ion energy analyzers of the diagnostic substrate 3 and configured to receive a signal related to the ion current from each of the one or more ion energy analyzers. Plasma processing system 1 can further comprise a controller 8. The controller 8 can be coupled to the first RF power system 4, the second RF power system 7, the DC power system 5, and the measurement electronics system 6, and can be configured to exchange data with each of these systems. For example, controller 8 can be configured to receive a signal related to the measured ion current and/or IED, and process this signal in order to determine the state of the plasma. For example, the controller 8 can correlate a change in the received ion current signal and/or IED with an endpoint for the etch process, a fault in the etch process, a plasma instability, etc.

Figure 2:
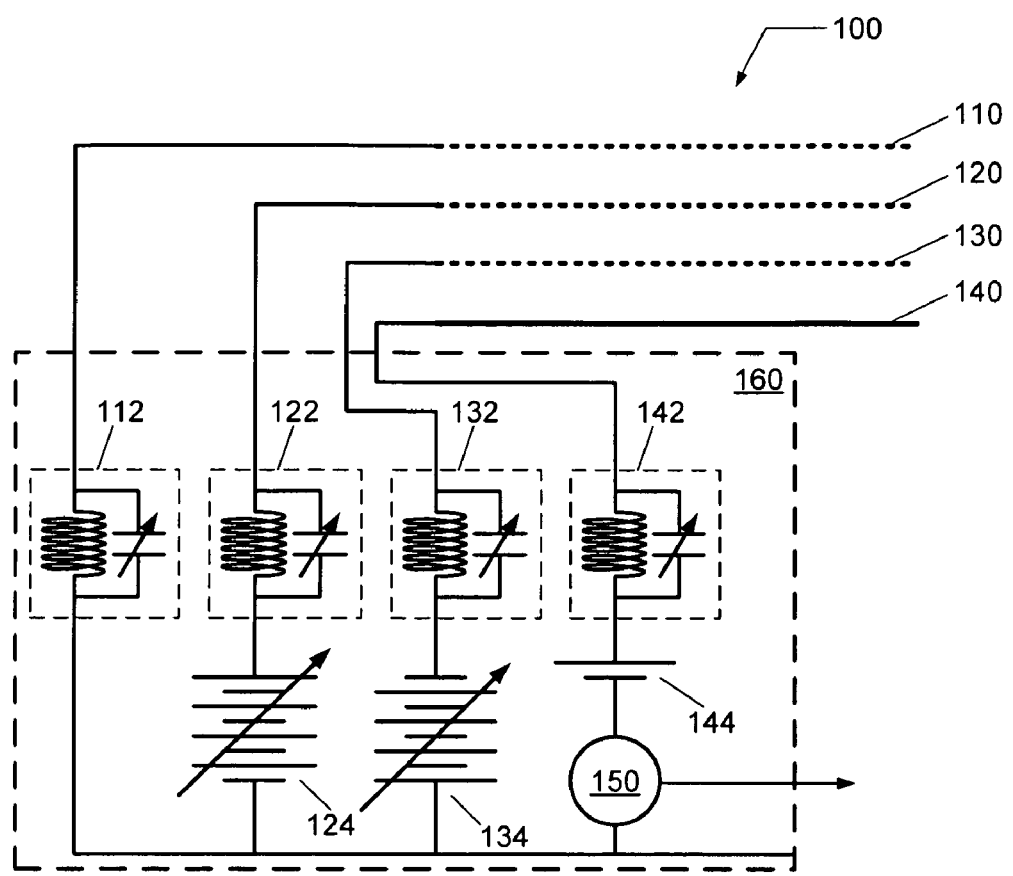
FIG. 2 shows a schematic representation of an ion energy analyzer according to an embodiment.

Referring now to FIG. 2, a schematic representation of an ion energy analyzer 100 is provided according to an embodiment. The ion energy analyzer 100 comprises an entrance grid 110 exposed to the plasma, an ion selection grid 120 disposed proximate to the entrance grid 110, an electron rejection grid 130 disposed proximate to the ion selection grid 120, and an ion current collector 140 disposed proximate to the electron rejection grid 130. The term "proximate", as used herein, refers to a first grid being next to or immediately adjacent to a second grid without another grid disposed there between.

The ion selection grid 120 is coupled to an ion selection voltage source 124 configured to positively bias the ion selection grid 120 by an ion selection voltage. The ion selection voltage may comprise a positive DC voltage ranging from about 0 V to a value greater than the difference between the DC self-bias potential of the entrance grid 110 and the (DC) plasma potential of the plasma from which the ions are extracted. The range of the ion selection voltage is chosen to be sufficiently wide to permit discrimination of the full range of ion energy for ions passing through the plasma sheath at the plasma boundary and entering the ion energy analyzer 100 through entrance grid 110. Only the ions having sufficient energy to overcome the potential barrier imposed by the ion selection grid 120 will pass through the ion selection grid 120 and strike the ion current collector 140.

The ion selection voltage source 124 may comprise a variable DC voltage source configured to bias the ion selection grid 120 with a positive DC ion selection voltage. The variable DC voltage source is configured to scan the ion selection voltage by varying the ion selection voltage between a first voltage value and a second voltage value.

The electron rejection grid 130 is coupled to an electron rejection voltage source 134 configured to negatively bias the electron rejection grid 130 by an electron rejection voltage. The electron rejection voltage may comprise a negative DC voltage set sufficiently high to reject all or nearly all electrons entering ion energy analyzer 100. For example, the electron rejection voltage may range from about −10 V to about −2500 V. Additionally, for example, the electron rejection voltage may range from about −500 V to about −2000 V. Further, for example, the electron rejection voltage may range from about −500 V to about −1500 V.

As shown in FIG. 1, if the second electrode 9 is biased with a negative DC voltage, then the electron rejection voltage should be set to a value greater than the DC voltage coupled to the second electrode 9. For instance, if the second electrode 9 is biased with −1000 V DC voltage, then the electron rejection voltage should be approximately −1000 V or greater (since the electron rejection grid will be expected to reject 1000 V electrons).

The ion current collector 140 may be biased by a negative DC voltage using a collector DC voltage source 144. A slight negative DC bias on the ion current collector 140 may be necessary to attract those ions that pass the ion selection grid 120 and the electron rejection grid 130.

The ion selection voltage and the electron rejection voltage may be referenced to the floating potential on the entrance grid 110.

Furthermore, an ion current meter 150 is coupled to the ion current collector 140 to measure a selected ion current resulting from ions incident on the ion current collector 140. The ion current meter 150 may comprise an operational amplifier (op-amp). The op-amp may include a micro-power op-amp, such as a model no. LPV531 programmable micro-power CMOS input rail-to-rail output op-amp, or model no. LPV511 micro-power rail-to-rail input and output op-amp, each commercially available from National Semiconductor Corporation (Santa Clara, Calif.).

A measurement electronics system 160 is coupled to the ion energy analyzer 100 and it is configured to, among other things, receive a signal related to the selected ion current at the ion current collector 140, process the signal, store the signal, and compute the IED for the plasma subject to diagnosis. When the one or more ion energy analyzers are immersed in plasma, the IED can be measured by varying the potential on the ion selection grid, and monitoring the selected ion current associated with those ions having sufficient energy to overcome the potential barrier imposed by the ion selection grid 120 grid and pass through the ion selection grid 120 and strike the ion current collector 140. By collecting and measuring the selected ion current as a function of the potential on the ion selection grid 120, an integrated form of the IED can be acquired. Differentiation of this integral leads to the IED.

In addition to receiving and processing a signal related to the selected ion current, the measurement electronics system 160 can set a constant output level to bias the ion current collector 140 using the collector DC voltage source 144, set a constant output level to negatively bias the electron rejection grid 130 using the electron rejection voltage source 134, and set a sweeping output level to positively bias the ion selection grid 120 using the ion selection voltage source 124.

Furthermore, a series of RF filters may be disposed between each grid and the measurement electronics system 160 in order to provide a high input impedance for the RF voltage at one or more RF frequencies on each grid. The ion energy analyzer 100 may comprise a first RF filter 112 disposed between the entrance grid 110 and the measurement electronics system 160, a second RF filter 122 disposed between the ion selection grid 120 and the measurement electronics system 160, a third RF filter 132 disposed between the electron rejection grid 130 and the measurement electronics system 160, and a fourth RF filter 142 disposed between the ion current collector 140 and the measurement electronics system 160. For example, each RF filter may comprise a notch or band-pass filter, or a low-pass filter.

By placing the electron rejection grid 130 proximate to the ion current collector 140, the contamination of the ion current signal by secondary electron emission within the ion energy analyzer 100 can be reduced. Secondary electron emission (SEE) may occur when a charged particle, such as an ion or electron, having sufficient energy strikes a grid or other surface in the ion energy analyzer 100 and causes the release of one or more electrons.

For example, as shown in FIG. 2, ions entering the ion energy analyzer 100 can cause SEE at several locations including: (1) Collisions between the incident ion flux with the entrance grid 110 can cause SEE, a fraction of these electrons are forward scattered further into the ion energy analyzer 100; (2) Collisions between the selected fraction of the incident ion flux with the ion selection grid 120 can cause SEE, a fraction of these electrons are forward scattered further into the ion energy analyzer 100; and (3) Collisions between the selected fraction of the incident ion flux with the electron rejection grid 130 can cause SEE, a fraction of these electrons are forward scattered to the ion current collector 140. SEE occurring at the ion current collector 140 are back scattered to the electron rejection grid 130 and trapped. Most of the forward scattered secondary electrons are rejected by the electron rejection grid 130 with the exception of those forward scattered secondary electrons arising from collisions between the selected fraction of the incident ion flux with the electron rejection grid 130.

Alternatively, for example, if the ion selection grid and the electron rejection grid were inter-changed (as in other ion energy analyzers) such that the ion selection grid is proximate the ion current collector, then ions entering the ion energy analyzer can cause SEE at several locations including: (1) Collisions between the incident ion flux with the entrance grid can cause SEE, a fraction of these electrons are forward scattered into the ion energy analyzer; (2) Collisions between the incident ion flux with the electron rejection grid can cause SEE, a fraction of these electrons are forward scattered to the ion current collector; and (3) Collisions between the selected fraction of the incident ion flux with the ion selection grid can cause SEE, a fraction of these electrons are forward scattered to the ion current collector. Only some of the forward scattered secondary electrons are rejected by the electron rejection grid. Secondary electrons forward scattered from the electron rejection grid and secondary electrons forward scattered and backward scattered from the ion selection grid can reach the ion current collector. Furthermore, SSE from the electron rejection grid is subject to the full spectrum of the incident ion flux, while for the embodiment depicted in FIG. 2, SEE from the electron rejection grid is subject to only the selected fraction of the incident ion flux.

In general, the use of the diagnostic substrate 3 having one or more ion energy analyzers can be implemented with any type of plasma processing system. In this example, the measurement of IED is performed in a RF powered capacitively coupled plasma (CCP) processing system between a first electrode and a second electrode. However, the measurement of IED using the diagnostic substrate may be performed in an inductively coupled plasma (ICP), a transformer coupled plasma (TCP), an electron cyclotron resonance (ECR) plasma, a helicon wave plasma, a surface wave plasma, a surface wave plasma formed using a slotted plane antenna, etc.

Figure 3:
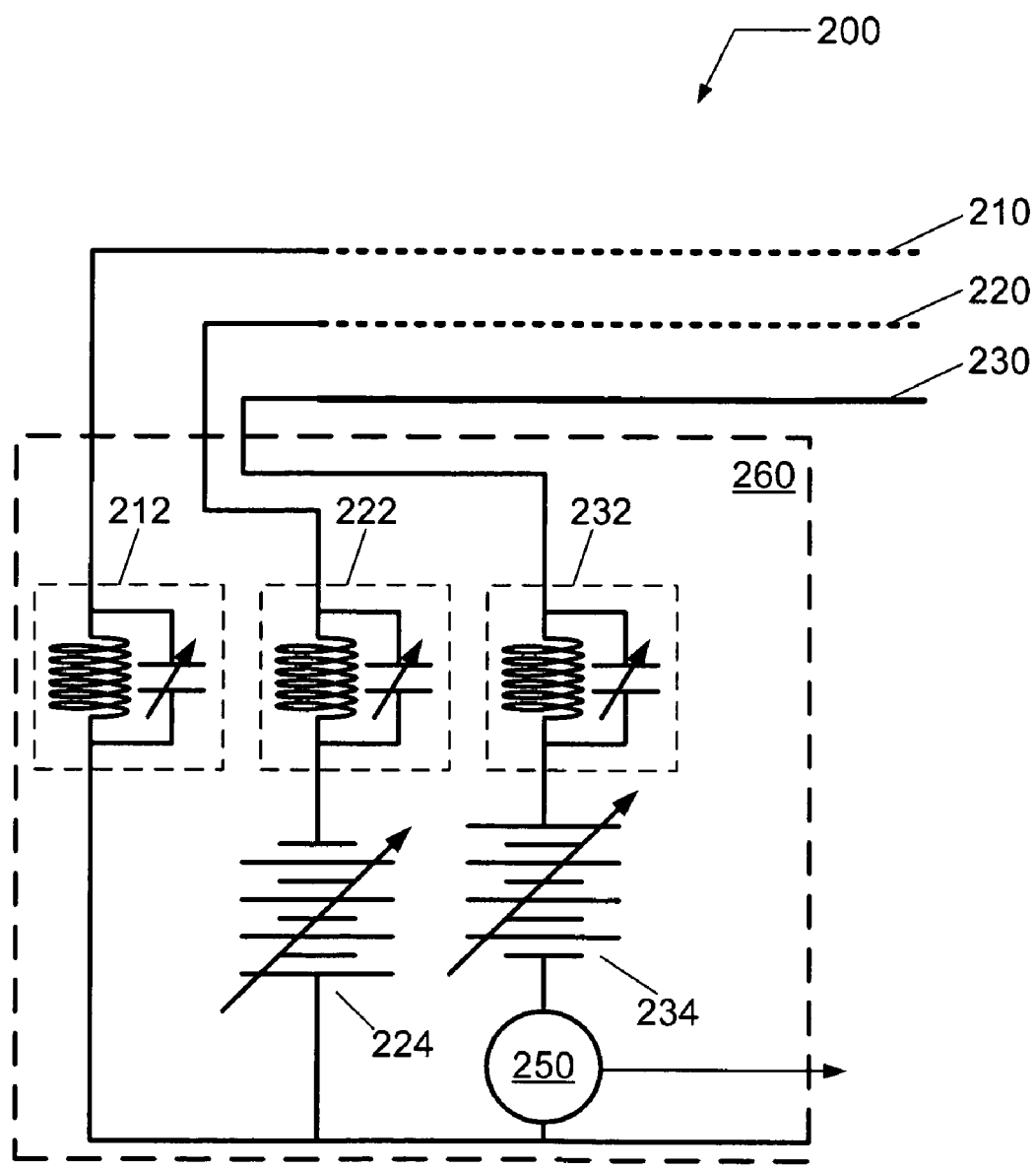
FIG. 3 shows a schematic representation of an ion energy analyzer according to another embodiment.

Referring now to FIG. 3, a schematic representation of an ion energy analyzer 200 is provided according to another embodiment. The ion energy analyzer 200 comprises an entrance grid 210 exposed to the plasma, an electron rejection grid 220 disposed proximate to the entrance grid 210, and an ion current collector 230 disposed proximate to the electron rejection grid 220. The ion current collector 230 serves the dual function of receiving ion current for measurement and selecting the ions that contribute to the received ion current. The term "proximate", as used herein, refers to a first grid being next to or immediately adjacent to a second grid without another grid disposed there between.

The ion current collector 230 is coupled to an ion selection voltage source 234 configured to positively bias the ion current collector 230 by an ion selection voltage. The ion selection voltage may comprise a positive DC voltage ranging from about 0 V to a value greater than the difference between the DC self-bias potential of the entrance grid 210 and the (DC) plasma potential of the plasma from which the ions are extracted. The range of the ion selection voltage is chosen to be sufficiently wide to permit discrimination of the full range of ion energy for ions passing through the plasma sheath at the plasma boundary and entering the ion energy analyzer 200 through entrance grid 210. Only the ions having sufficient energy to overcome the potential barrier imposed by the ion current collector 230 will strike the ion current collector 230.

The ion selection voltage source 234 may comprise a variable DC voltage source configured to bias the ion current collector 230 with a positive DC ion selection voltage. The variable DC voltage source is configured to scan the ion selection voltage by varying the ion selection voltage between a first voltage value and a second voltage value.

The electron rejection grid 220 is coupled to an electron rejection voltage source 224 configured to negatively bias the electron rejection grid 220 by an electron rejection voltage. The electron rejection voltage may comprise a negative DC voltage set sufficiently high to reject all or nearly all electrons entering ion energy analyzer 200. For example, the electron rejection voltage may range from about −10 V to about −2500 V. Additionally, for example, the electron rejection voltage may range from about −500 V to about −2000 V. Further, for example, the electron rejection voltage may range from about −500 V to about −1500 V.

As shown in FIG. 1, if the second electrode 9 is biased with a negative DC voltage, then the electron rejection voltage should be set to a value greater than the DC voltage coupled to the second electrode 9. For instance, if the second electrode 9 is biased with −1000 V DC voltage, then the electron rejection voltage should be approximately −1000 V or greater (since the electron rejection grid will be expected to reject 1000 V electrons).

The ion selection voltage and the electron rejection voltage may be referenced to the floating potential on the entrance grid 210.

Furthermore, an ion current meter 250 is coupled to the ion current collector 230 to measure the ion current. The ion current meter 250 may comprise an operational amplifier (op-amp) as described above.

Also, as described above, a measurement electronics system 260 is coupled to the ion energy analyzer 200 and it is configured to, among other things, receive a signal related to a selected ion current at the ion current collector 230, process the signal, store the signal, and assemble the IED for the plasma subject to diagnosis. When the one or more ion energy analyzers are immersed in plasma, the IED can be measured by varying the potential on the ion selection grid, and monitoring the ion current associated with those ions having sufficient energy to overcome the potential barrier imposed by the ion current collector 230 and strike the ion current collector 230. By collecting and measuring the selected ion current as a function of the potential on the ion current collector 230, an integrated form of the IED can be acquired. Differentiation of this integral leads to the IED.

In addition to receiving and processing a signal related to the selected ion current, the measurement electronics system 260 can set a sweeping output level to positively bias the ion current collector 230 using the ion selection voltage source 234, and set a constant output level to negatively bias the electron rejection grid 220 using the electron rejection voltage source 224.

Furthermore, a series of RF filters may be disposed between each grid and the measurement electronics system 260 in order to provide a high input impedance for the RF voltage at one or more RF frequencies on each grid. The ion energy analyzer 200 may comprise a first RF filter 212 disposed between the entrance grid 210 and the measurement electronics system 260, a second RF filter 222 disposed between the electron rejection grid 220 and the measurement electronics system 260, and a third RF filter 232 disposed between the ion current collector 230 and the measurement electronics system 260. For example, each RF filter may comprise a notch or band-pass filter, or a low-pass filter.

Figure 4:
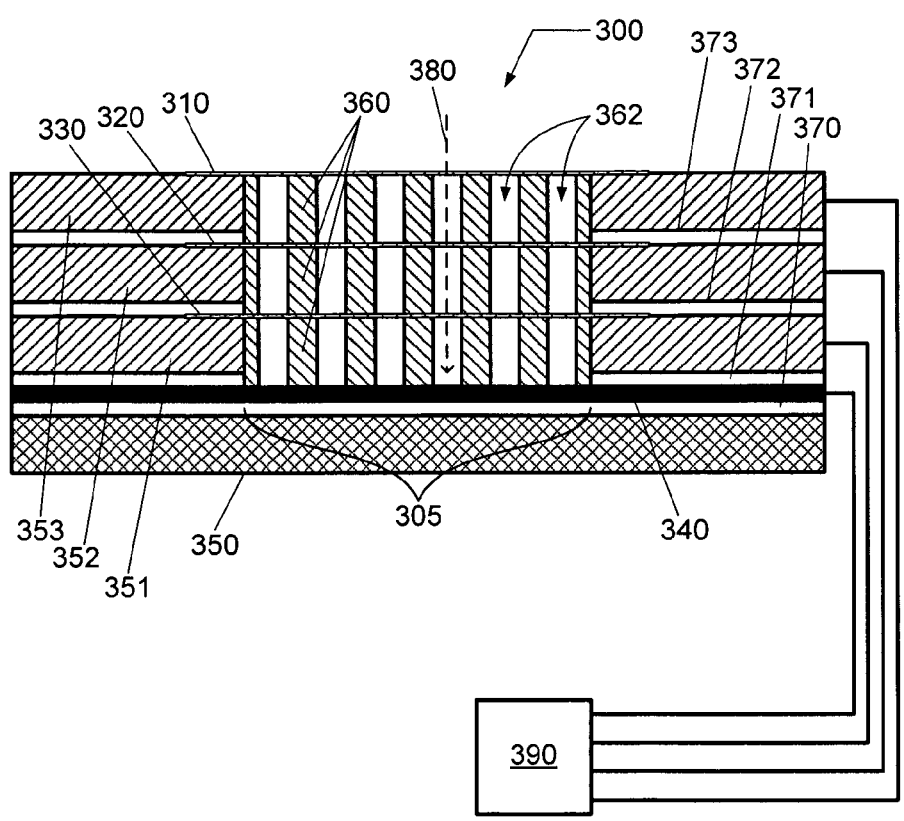
FIG. 4 provides a cross-sectional view of an ion energy analyzer according to another embodiment.

Referring now to FIG. 4, a schematic representation of an ion energy analyzer 300 is provided according to another embodiment. The schematic representation of the ion energy analyzer 300 illustrates one approach to making the ion energy analyzer 300. The ion energy analyzer 300 comprises a substrate 350, a first insulator 370 disposed on the substrate 350, and an ion current collector 340 disposed on the first insulator 370. Additionally, the ion energy analyzer 300 comprises a second insulator 371 disposed on the ion current collector 340, wherein the second insulator 371 has an aperture 305 formed there through to expose a collection area on the ion current collector 340 to a selected ion flux 380.

The ion energy analyzer 300 further comprises a first conductive electrode 351 disposed on the second insulator 371, wherein the first conductive electrode 351 has the aperture 305 formed there through and aligned with the same in the second insulator 371. An electron rejection grid 330 is disposed on the first conductive electrode 351, wherein it extends over the aperture 305. The electron rejection grid 330 partially overlaps the first conductive electrode 351 and fully extends over and across the aperture 305 as shown in FIG. 4. The first conductive electrode 351 is configured to be biased by a negative DC voltage in order to negatively bias the electron rejection grid 330 as described above. Hence, the electron rejection grid 330 is configured to make good electrical contact with the first conductive electrode 351. Additionally, the ion energy analyzer 300 comprises a third insulator 372 disposed on the first conductive electrode 351, wherein the third insulator 372 has the aperture 305 formed there through and aligned with the same in the first conductive electrode 351.

The ion energy analyzer 300 further comprises a second conductive electrode 352 disposed on the third insulator 372, wherein the second conductive electrode 352 has the aperture 305 formed there through and aligned with the same in the third insulator 372. An ion selection grid 320 is disposed on the second conductive electrode 352, wherein it extends over the aperture 305. The ion selection grid 320 partially overlaps the second conductive electrode 352 and fully extends over and across the aperture 305 as shown in FIG. 4. The second conductive electrode 352 is configured to be biased by a positive DC voltage in order to positively bias the ion selection grid 320 as described above in FIG. 2. Hence, the ion selection grid 320 is configured to make good electrical contact with the second conductive electrode 352. Additionally, the ion energy analyzer 300 comprises a fourth insulator 373 disposed on the second conductive electrode 352, wherein the fourth insulator 373 has the aperture 305 formed there through and aligned with the same in the second conductive electrode 352.

The ion energy analyzer 300 further comprises a third conductive electrode 353 disposed on the fourth insulator 373, wherein the third conductive electrode 353 has the aperture 305 formed there through and aligned with the same in the fourth insulator 373. An entrance grid 310 disposed on the third conductive electrode 353, wherein it extends over the aperture 305. The entrance grid 310 partially overlaps the third conductive electrode 353 and fully extends over and across the aperture 305 as shown in FIG. 4. The third conductive electrode 353 is configured to be at a DC self-bias potential as described above. The entrance grid 310 is configured to make good electrical contact with the third conductive electrode 353.

Using the ion energy analyzer 300, data may be collected, processed and stored by a measurement electronics system 390. The measurement electronics system 390 is coupled to the ion energy analyzer 300, and is configured to receive a signal from an ion current meter related to a selected ion current received by the ion current collector 340 and store the signal as a function of the ion selection voltage. The ion energy analyzer 300, including the ion selection grid 320, the electron rejection grid 330, and the ion current collector 340, may be operated as described above to measure the selected ion current and/or IED for the plasma subject to diagnosis.

The ion energy analyzer 300 is prepared on substrate 350 as shown in FIG. 4 in such a way that perturbations to the processing plasma (relative to a production substrate) are kept to a minimum. The area of the aperture 305 is relatively small compared to the total area of substrate 350, while the thickness of the substrate 350 is relatively thin. By doing so, the ion current collector 340, the first conductive electrode 351, the second conductive electrode 352, and the third conductive electrode 353 are designed with a relatively high capacitance to the RF powered electrode above which the substrate 350 rests. Desirably, the RF voltage on the ion current collector 340, the first conductive electrode 351, the second conductive electrode 352, and the third conductive electrode 353 has substantially the same magnitude and phase.

According to one example, the substrate 350 may comprise a silicon substrate. The use of silicon allows the ion energy analyzer 300 to mimic the contact between a silicon production substrate and the substrate holder. However, other materials may be used. The ion current collector 340, the first conductive electrode 351, the second conductive electrode 352, and the third conductive electrode 353 may be fabricated from a metallic plate, such as a stainless steel plate. However, other materials may be used. The first insulator 370, the second insulator 371, the third insulator 372, and the fourth insulator 373 may comprise polyimide sheet (such as Kapton®) having double-sided adhesive. However, other materials may be used. For example, the ion energy analyzer 300 may be fabricated to have a thickness of about 3 to 5 mm, or less.

The electron rejection grid 330, the ion selection grid 320 and the entrance grid 310 may comprise a metallic mesh, such as stainless steel mesh. Each grid may be brazed or welded to the respective conductive electrode it contacts. The size of the mesh openings for the entrance grid 310 is selected to be about a sub-Debye length or smaller. The Debye length represents the characteristic distance over which significant charge densities may spontaneously exist. Under this condition, the plasma sheath at the boundary of the plasma subject to diagnosis is relatively unperturbed by the presence of the ion energy analyzer, i.e., the plasma sheath edge does not extend into the ion energy analyzer. Further, the ion selection grid 320 and the electron rejection grid 330 may comprise a mesh having openings approximately equal to the Debye length or smaller. For typical plasma, the Debye length may be about 100 microns.

Referring still to FIG. 4, the ion energy analyzer 300 may further comprise one or more dielectric members 360 inserted between and configured to space apart each of the entrance grid 310, the ion selection grid 320, the electron rejection grid 330, and the ion current collector 340, wherein each of the one or more dielectric members 360 comprises a plurality of openings 362 extending there through to permit passage of the selected ion flux 380 to the ion current collector 340. The one or more dielectric members 360 may, for example, comprise quartz or alumina; however, other materials may be used. As an example, each dielectric member 360 may be about 1 mm thick and about 35 to 40 mm in diameter. Further, as an example, each dielectric member 360 may comprise about 40 to 50 openings 362, wherein each opening 362 is about 3 mm in diameter.

Figure 6:
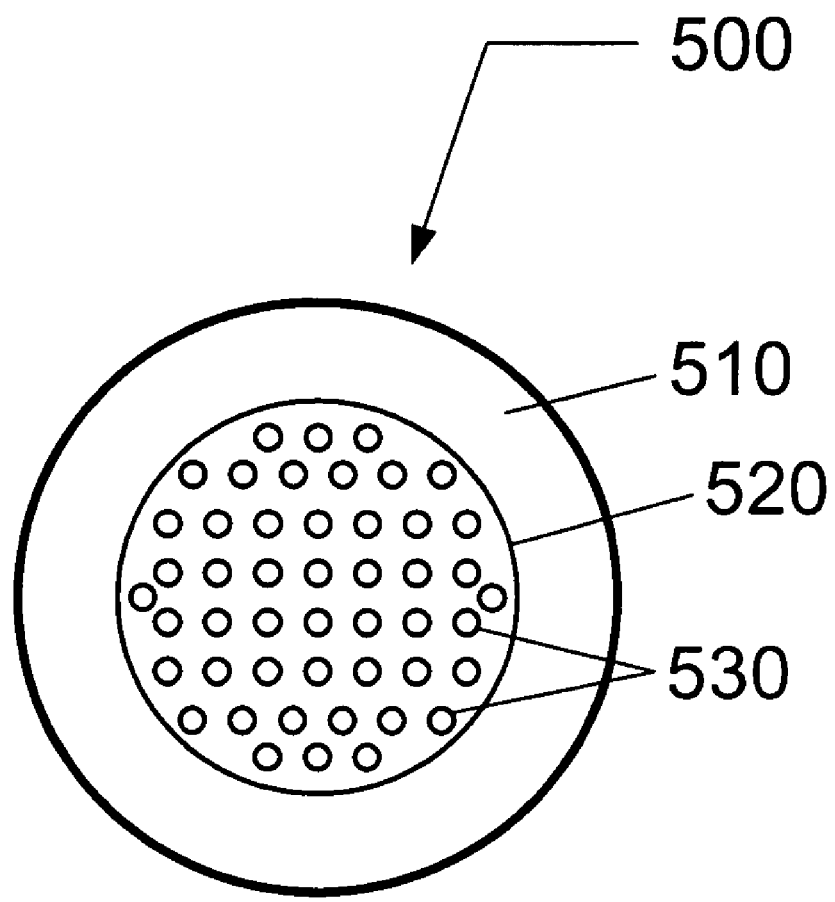
FIG. 6 provides a top view of an ion energy analyzer according to another embodiment.

FIG. 6 provides a top view of an ion energy analyzer 500 comprising an entrance grid 510 and a dielectric member 520 beneath and supporting the entrance grid 510. Further, as illustrated, the dielectric member 520 comprises a plurality of openings 530 extending through the dielectric member 520.

Figure 5:
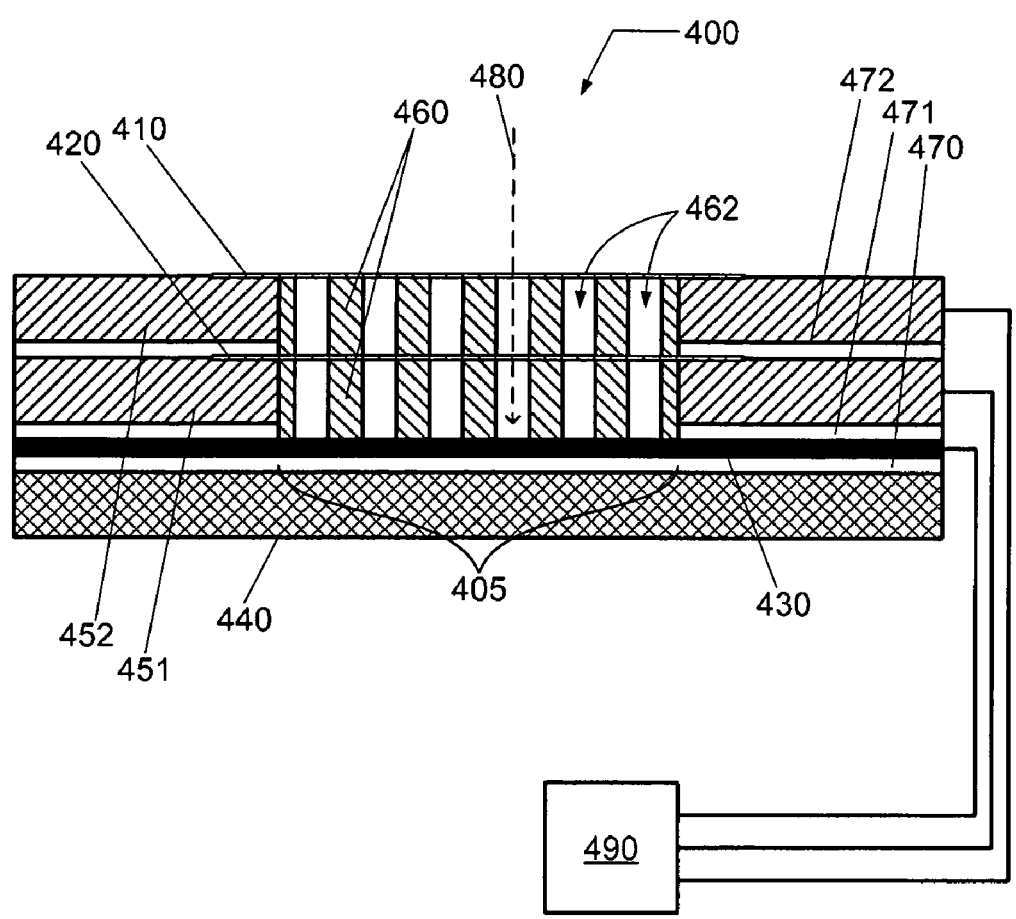
FIG. 5 provides a cross-sectional view of an ion energy analyzer according to another embodiment.

Referring now to FIG. 5, a schematic representation of an ion energy analyzer 400 is provided according to another embodiment. The schematic representation of the ion energy analyzer 400 illustrates one approach to making the ion energy analyzer 400. The ion energy analyzer 400 comprises a substrate 440, a first insulator 470 disposed on the substrate 440, and an ion current collector 430 disposed on the first insulator 470. Additionally, the ion energy analyzer 400 comprises a second insulator 471 disposed on the ion current collector 430, wherein the second insulator 471 has an aperture 405 formed there through to expose a collection area on the ion current collector 430 to a selected ion flux 480. The ion current collector 430 is configured to be biased by a positive DC voltage in order to positively bias the ion current collector 430 as described above in FIG. 3.

The ion energy analyzer 400 further comprises a first conductive electrode 451 disposed on the second insulator 471, wherein the first conductive electrode 451 has the aperture 405 formed there through and aligned with the same in the second insulator 471. An electron rejection grid 420 is disposed on the first conductive electrode 451, wherein it extends over the aperture 405. The electron rejection grid 420 partially overlaps the first conductive electrode 451 and fully extends over and across the aperture 405 as shown in FIG. 5. The first conductive electrode 451 is configured to be biased by a negative DC voltage in order to negatively bias the electron rejection grid 420 as described above. Hence, the electron rejection grid 420 is configured to make good electrical contact with the first conductive electrode 451. Additionally, the ion energy analyzer 400 comprises a third insulator 472 disposed on the first conductive electrode 451, wherein the third insulator 472 has the aperture 405 formed there through and aligned with the same in the first conductive electrode 451.

The ion energy analyzer 400 further comprises a second conductive electrode 452 disposed on the third insulator 472, wherein the second conductive electrode 452 has the aperture 405 formed there through and aligned with the same in the third insulator 472. An entrance grid 410 disposed on the second conductive electrode 452, wherein it extends over the aperture 405. The entrance grid 410 partially overlaps the second conductive electrode 452 and fully extends over and across the aperture 405 as shown in FIG. 5. The second conductive electrode 452 is configured to be at a DC self-bias potential as described above. The entrance grid 410 is configured to make good electrical contact with the second conductive electrode 452.

Using the ion energy analyzer 400, data may be collected, processed and stored by a measurement electronics system 490. The measurement electronics system 490 is coupled to the ion energy analyzer 400, and is configured to receive a signal from an ion current meter related to a selected ion current received by the ion current collector 430 and store the signal as a function of the ion selection voltage. The ion energy analyzer 400, including the ion current collector 430 and the electron rejection grid 420, may be operated as described above to measure the ion current and/or IED for the plasma subject to diagnosis.

The ion energy analyzer 400 is prepared on substrate 440 as shown in FIG. 5 in such a way that perturbations to the processing plasma (relative to a production substrate) are kept to a minimum. The area of the aperture 405 is relatively small compared to the total area of substrate 440, while the thickness of the substrate 440 is relatively thin. By doing so, the ion current collector 430, the first conductive electrode 451, and the second conductive electrode 452 are designed with a relatively high capacitance to the RF powered electrode above which the substrate 440 rests. Desirably, the RF voltage on the ion current collector 430, the first conductive electrode 451, and the second conductive electrode 452 has substantially the same magnitude and phase.

According to one example, the substrate 440 may comprise a silicon substrate. The use of silicon allows the ion energy analyzer 400 to mimic the contact between a silicon production substrate and the substrate holder. However, other materials may be used. The ion current collector 430, the first conductive electrode 451, and the second conductive electrode 452 may be fabricated from a metallic plate, such as a stainless steel plate. However, other materials may be used. The first insulator 470, the second insulator 471, and the third insulator 472 may comprise polyimide sheet (such as Kapton®) having double-sided adhesive. However, other materials may be used. For example, the ion energy analyzer 400 may be fabricated to have a thickness of about 2 to 4 mm, or less.

The electron rejection grid 420 and the entrance grid 410 may comprise a metallic mesh, such as stainless steel mesh. Each grid may be brazed or welded to the respective conductive electrode it contacts. The size of the mesh openings for the entrance grid 410 is selected to be about a sub-Debye length or smaller. Under this condition, the plasma sheath at the boundary of the plasma subject to diagnosis is relatively unperturbed by the presence of the ion energy analyzer, i.e., the plasma sheath edge does not extend into the ion energy analyzer. Further, the electron rejection grid 420 may comprise a mesh having openings approximately equal to the Debye length or smaller. For typical plasma, the Debye length may be about 100 microns.

Referring still to FIG. 5, the ion energy analyzer 400 may further comprise one or more dielectric members 460 inserted between and configured to space apart each of the entrance grid 410, the electron rejection grid 420, and the ion current collector 430, wherein each of the one or more dielectric members 460 comprises a plurality of openings 462 extending there through to permit passage of the selected ion flux 480 to the ion current collector 430. The one or more dielectric members 460 may, for example, comprise quartz or alumina; however, other materials may be used. As an example, each dielectric member 460 may be about 1 mm thick and about 35 to 40 mm in diameter. Further, as an example, each dielectric member 460 may comprise about 40 to 50 openings 462, wherein each opening 462 is about 3 mm in diameter.

Figure 7A:
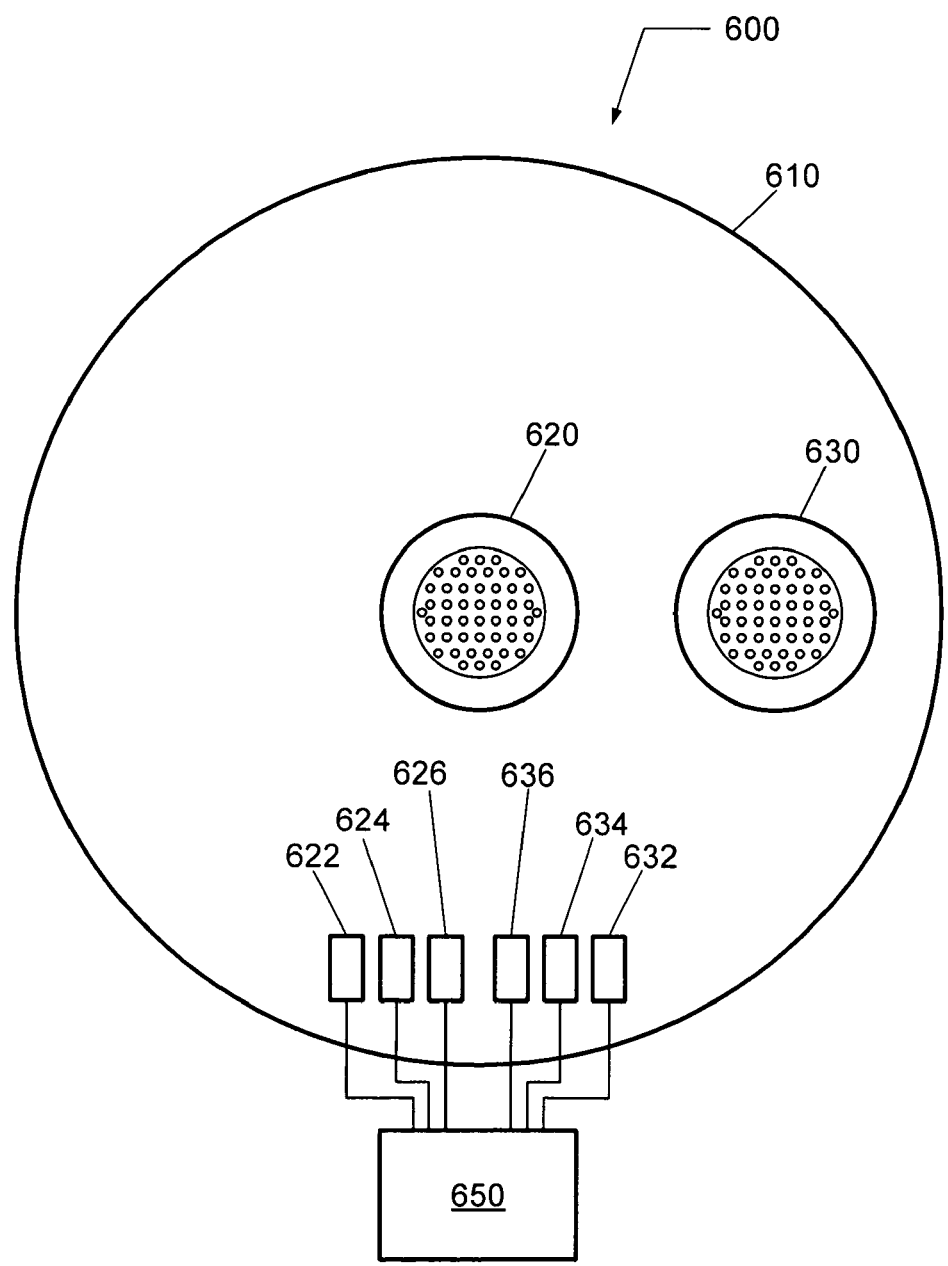
FIG. 7A shows a top view of an IED substrate comprising a plurality of ion energy analyzers according to another embodiment.

Referring now to FIG. 7A, a top view of a diagnostic substrate 600 comprising a plurality of ion energy analyzers is provided according to another embodiment. The diagnostic substrate 600 comprises a substrate 610 having a first ion energy analyzer 620 located at a substantially central region of the substrate 610 and a second ion energy analyzer 630 located at a substantially edge region of the substrate 610. The first and second ion energy analyzers 620 and 630 may include any one of the ion energy analyzers described in FIGS. 2 and 4.

A measurement electronics system 650 couples a positive ion selection voltage to the first ion energy analyzer 620 via a first ion selection feed-through circuit 622, a negative electron rejection voltage to the first ion energy analyzer 620 via a first electron rejection feed-through circuit 624, and contacts an ion current collector for the first ion energy analyzer 620 via a first ion current collector feed-through circuit 626. The positive ion selection voltage may be coupled to the ion selection grid as described in FIGS. 2 and 4. For example, the first ion selection feed-through circuit 622 makes electrical contact with a second conductive electrode, as shown in FIG. 4, for the first ion energy analyzer 620, the first electron rejection feed-through circuit 624 makes electrical contact with a first conductive electrode, as shown in FIG. 4, for the first ion energy analyzer 620, and the first ion current collector feed-through circuit 626 makes electrical contact with an ion current collector, as shown in FIG. 4, for the first ion energy analyzer 620.

Additionally, the measurement electronics system 650 couples a positive ion selection voltage to the second ion energy analyzer 630 via a second ion selection feed-through circuit 632, a negative electron rejection voltage to the second ion energy analyzer 630 via a second electron rejection feed-through circuit 634, and contacts an ion current collector for the second ion energy analyzer 630 via a first ion current collector feed-through circuit 636. The positive ion selection voltage may be coupled to the ion selection grid as described in FIGS. 2 and 4. For example, the second ion selection feed-through circuit 632 makes electrical contact with a second conductive electrode, as shown in FIG. 4, for the second ion energy analyzer 630, the second electron rejection feed-through circuit 634 makes electrical contact with a first conductive electrode, as shown in FIG. 4, for the second ion energy analyzer 630, and the second ion current collector feed-through circuit 636 makes electrical contact with an ion current collector, as shown in FIG. 4, for the second ion energy analyzer 630.

The measurement electronics system 650 may be coupled to each of the feed-through circuits using a wired connection or a wireless connection.

Figure 7B:
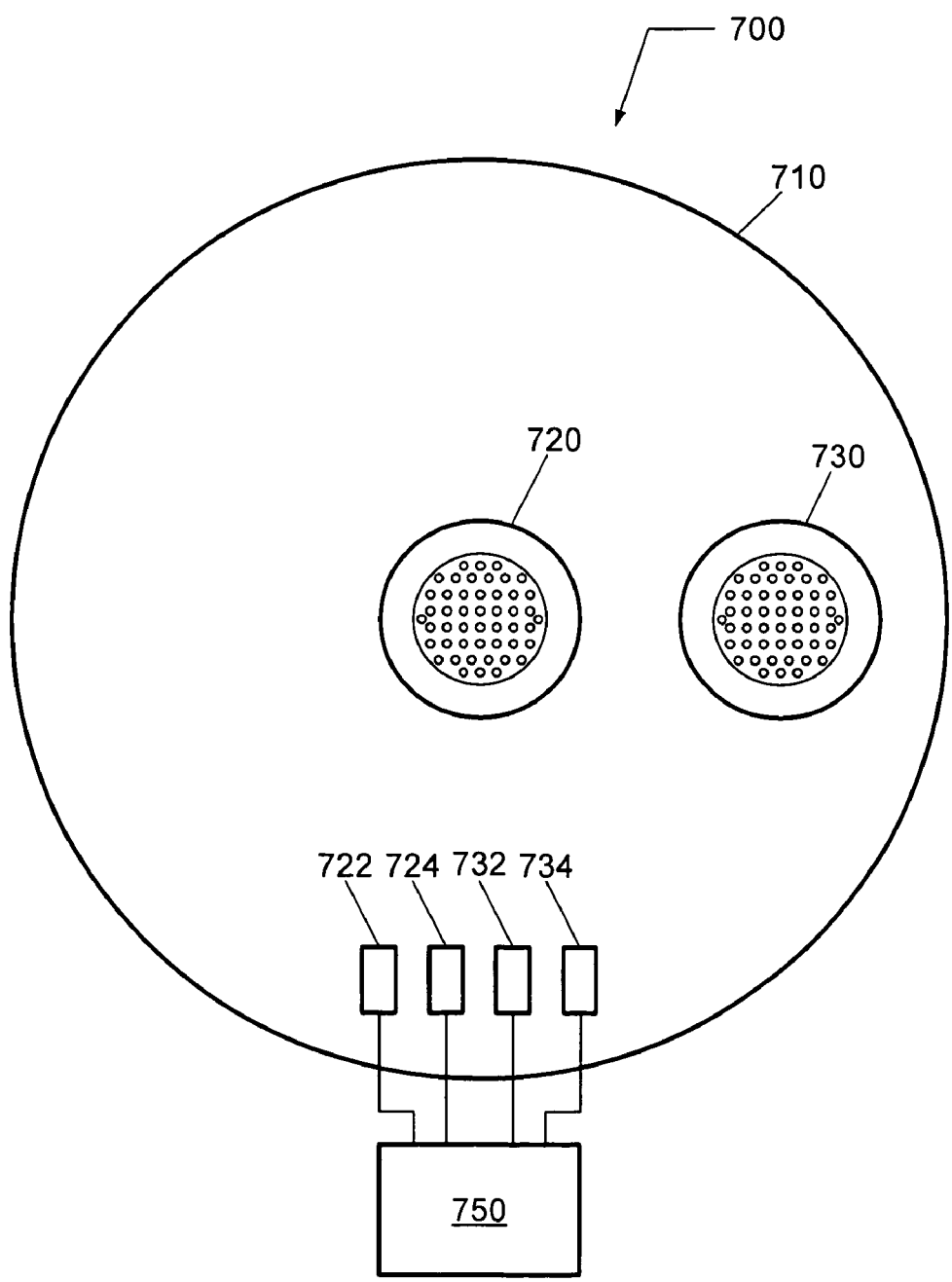
FIG. 7B shows a top view of an IED substrate comprising a plurality of ion energy analyzers according to another embodiment.

Referring now to FIG. 7B, a top view of a diagnostic substrate 700 comprising a plurality of ion energy analyzers is provided according to another embodiment. The diagnostic substrate 700 comprises a substrate 710 having a first ion energy analyzer 720 located at a substantially central region of the substrate 710 and a second ion energy analyzer 730 located at a substantially edge region of the substrate 710. The first and second ion energy analyzers 720 and 730 may include any one of the ion energy analyzers described in FIGS. 3 and 5.

A measurement electronics system 750 couples a positive ion selection voltage to the first ion energy analyzer 720 via a first ion selection feed-through circuit 722, and a negative electron rejection voltage to the first ion energy analyzer 720 via a first electron rejection feed-through circuit 724. The positive ion selection voltage may be coupled to the ion current collector as described in FIGS. 3 and 5. For example, the first ion selection feed-through circuit 722 makes electrical contact with an ion current collector, as shown in FIG. 5, for the first ion energy analyzer 720, and the first electron rejection feed-through circuit 724 makes electrical contact with a first conductive electrode, as shown in FIG. 5, for the first ion energy analyzer 720.

Additionally, the measurement electronics system 750 couples a positive ion selection voltage to the second ion energy analyzer 730 via a second ion selection feed-through circuit 732, and a negative electron rejection voltage to the second ion energy analyzer 730 via a second electron rejection feed-through circuit 734. The positive ion selection voltage may be coupled to the ion selection grid as described in FIGS. 3 and 5. For example, the second ion selection feed-through circuit 732 makes electrical contact with an ion current collector, as shown in FIG. 5, for the second ion energy analyzer 730, and the second electron rejection feed-through circuit 734 makes electrical contact with a first conductive electrode, as shown in FIG. 5, for the second ion energy analyzer 730.

The measurement electronics system 750 may be coupled to each of the feed-through circuits using a wired connection or a wireless connection.

Figure 8:
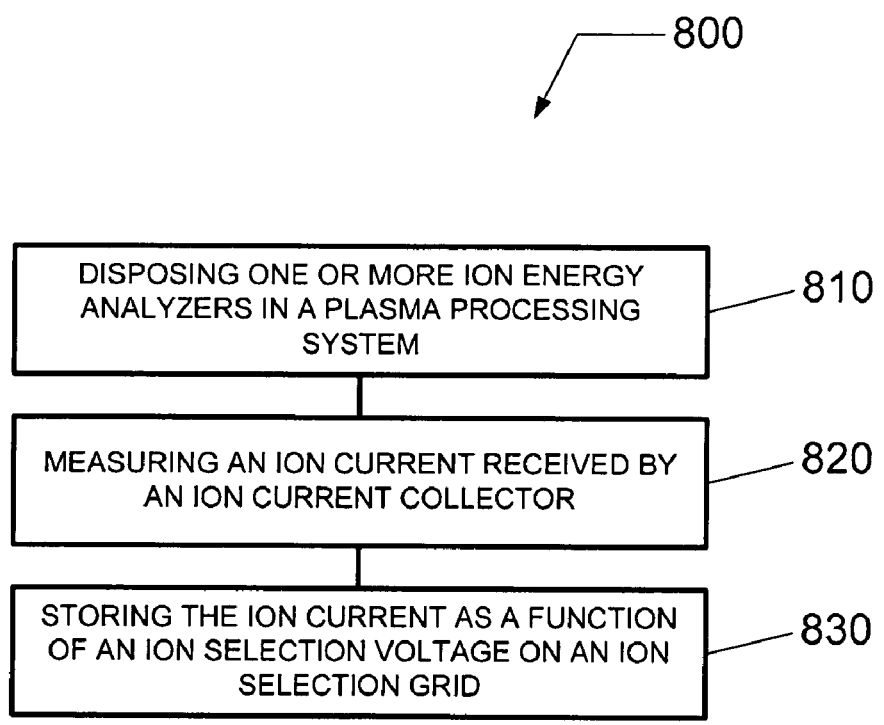
FIG. 8 illustrates a method of using an ion energy analyzer according to another embodiment.

Referring now to FIG. 8, a flow chart 800 is provided of a method of measuring IED at one or more locations in a plasma processing system according to an embodiment. Flow chart 800 begins in 810 with disposing one or more ion energy analyzers on a substrate holder in a plasma processing system. The one or more ion energy analyzers may include any one of the ion energy analyzers described in FIGS. 2 and 4. Therein, the fraction of the ion flux selected to reach the ion current collector using the ion selection grid is chosen prior to rejecting electrons from reaching the ion current collector.

In 820, an ion current received by the ion current collector is measured.

In 830, the ion current is stored as a function of the ion selection voltage on the ion selection grid.

Figure 9:
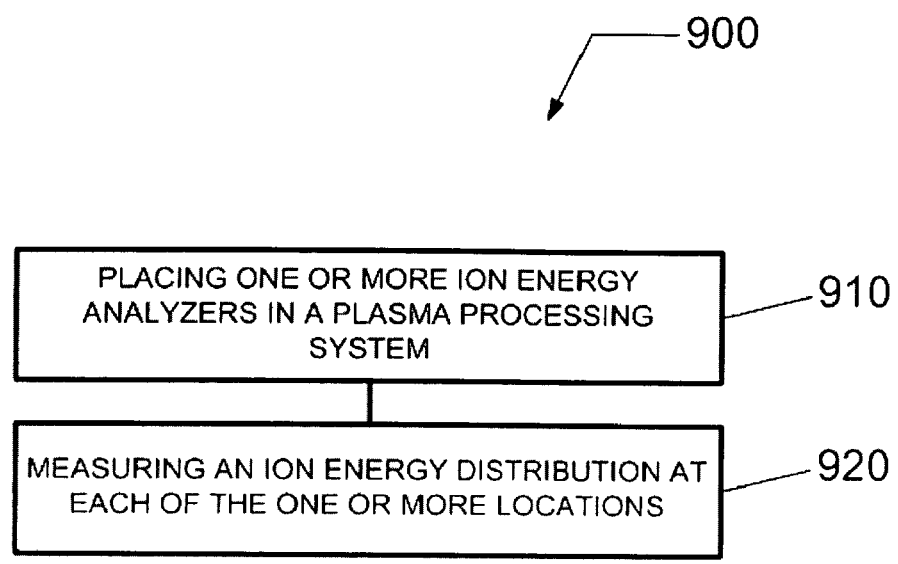
FIG. 9 illustrates a method of using an ion energy analyzer according to yet another embodiment.

Referring now to FIG. 9, a flow chart 900 is provided of a method of measuring IED at one or more locations in a plasma processing system according to an embodiment. Flow chart 900 begins in 910 with placing one or more ion energy analyzers at the one or more locations on a substrate holder in a plasma processing system. The one or more ion energy analyzers may include any one of the ion energy analyzers described in FIGS. 3 and 5. Therein, the ion current collector serves the dual function of receiving ion current for measurement and selecting the ions that contribute to the received ion current.

In 920, an IED is measured at each of the one or more locations by performing the following: (i) exposing an entrance grid to plasma at a floating DC potential; (ii) biasing an electron rejection grid proximate to the entrance grid with a negative DC voltage to reject electrons from the plasma; (iii) biasing an ion current collector proximate to the electron rejection grid with a positive DC voltage to discriminate between ions reaching the ion current collector; (iv) measuring a selected ion current at the ion current collector using a current meter; (v) storing the selected ion current as a function of the positive DC voltage on the ion current collector; and (vi) varying the positive DC voltage on the ion current collector. Thereafter, the stored ion current data as a function of the ion selection voltage may be integrated to determine an IED.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. An ion energy analyzer for use in diagnosing the ion energy distribution (IED) of plasma, comprising:
an entrance grid exposed to the bulk plasma volume at a reference voltage and located at an outermost plane of the ion energy analyzer, said entrance grid comprises a plurality of openings, wherein a size of each of said plurality of openings is selected to be sub-Debye length or smaller for said plasma such that a plasma sheath at a boundary of said plasma at said outermost plane remains relatively unperturbed and said plasma sheath does not penetrate said entrance grid and extend into the ion energy analyzer;
an electron rejection grid disposed proximate to said entrance grid, wherein said electron rejection grid is coupled to an electron rejection voltage source configured to negatively bias said electron rejection grid at an electron rejection voltage;
an ion current collector disposed proximate to said electron rejection grid, wherein said ion current collector is coupled to an ion selection voltage source configured to positively bias said ion current collector at an ion selection voltage; and
an ion current meter coupled to said ion current collector and configured to provide a signal related to said selected ion current.

2. The ion energy analyzer of claim 1, further comprising:
a measurement electronics system coupled to said ion energy analyzer, and configured to receive said signal from said ion current meter related to said selected ion current received by said ion current collector and store said signal as a function of said ion selection voltage.

3. The ion energy analyzer of claim 2, wherein said coupling between said ion energy analyzer and said measurement electronics system comprises a wired connection or a wireless connection.

4. The ion energy analyzer of claim 1, wherein said electron rejection grid comprises a mesh having sub-Debye openings there through.

5. The ion energy analyzer of claim 1, wherein said ion selection voltage source is configured to vary said ion selection voltage from a first voltage value to a second voltage value.

6. The ion energy analyzer of claim 1, wherein said ion selection voltage source comprises a variable direct current (DC) voltage source configured to bias said ion current collector by a positive DC voltage referenced to a potential on said entrance grid and scan said positive DC voltage.

7. The ion energy analyzer of claim 1, wherein said electron rejection voltage source comprises a DC voltage source configured to bias said electron rejection grid by a negative DC voltage referenced to a potential on said entrance grid.

8. The ion energy analyzer of claim 1, wherein said electron rejection voltage ranges from about −500 V to about −1500 V.

9. The ion energy analyzer of claim 2, wherein said ion energy analyzer is configured to rest upon a substrate holder in a plasma processing system, and wherein said substrate holder is coupled to a RF voltage at one or more RF frequencies and said ion energy analyzer floats at said RF voltage.

10. The ion energy analyzer of claim 9, wherein said ion selection voltage source comprises a variable DC voltage source configured to bias said ion current collector by a positive DC voltage referenced to a potential on said entrance grid and scan said positive DC voltage, and wherein said electron rejection voltage source comprises a DC voltage source configured to bias said electron rejection grid by a negative DC voltage referenced to a potential on said entrance grid.

11. The ion energy analyzer of claim 9, further comprising:
a first RF filter disposed between said entrance grid and said measurement electronics system;
a second RF filter disposed between said electron rejection grid and said measurement electronics system; and
a third RF filter disposed between said ion current collector and said measurement electronics system,
wherein each of said first RF filter, said second RF filter, and said third RF filter comprise a high input impedance at said one or more RF frequencies.

12. The ion energy analyzer of claim 1, further comprising:
one or more dielectric members inserted between and configured to space apart each of said entrance grid, said electron rejection grid, and said ion current collector, wherein each of said one or more dielectric members comprises a plurality of openings extending there through to permit passage of said selected ion current to said ion current collector.

13. An ion energy analyzer for use in diagnosing the ion energy distribution (IED) of plasma, comprising:
a substrate;
a first insulator disposed on said substrate;
an ion current collector disposed on said first insulator;
a second insulator disposed on said ion current collector, said second insulator having an aperture formed there through to expose a collection area on said ion current collector;
a first conductive electrode disposed on said second insulator, said first conductive electrode having said aperture formed there through and aligned with said aperture in said second insulator;
an electron rejection grid disposed on said first conductive electrode and extending over said aperture;
a third insulator disposed on said first conductive electrode, said third insulator having said aperture formed there through and aligned with said aperture in said first conductive electrode;
a second conductive electrode disposed on said third insulator, said second conductive electrode having said aperture formed there through and aligned with said aperture in said third insulator;
an entrance grid disposed on said second conductive electrode and extending over said aperture, said entrance grid located at an outermost plane of the ion energy analyzer and exposed to the bulk plasma volume, wherein said entrance grid comprises a plurality of openings, and wherein a size of each of said plurality of openings is selected to be sub-Debye length or smaller for said plasma such that a plasma sheath at a boundary of said plasma at said outermost plane remains relatively unperturbed and said plasma sheath does not penetrate said entrance grid and extend into the ion energy analyzer;
wherein said second conductive electrode is configured to develop a DC self-bias voltage in said plasma,
wherein said first conductive electrode is configured to be coupled to a negative DC voltage referenced to said DC self-bias voltage on said second conductive electrode,
wherein said ion current collector is configured to be coupled to a positive DC voltage referenced to said DC self-bias voltage on said second conductive electrode, wherein a selected ion current received at said ion current collector is configured to be measured by an ion current meter, and wherein said aperture permits said selected ion current to flow from said plasma to said ion current collector.

14. The ion energy analyzer of claim 13, further comprising:

a measurement electronics system coupled to said ion energy analyzer, and configured to receive a signal from said ion current meter related to said selected ion current received by said ion current collector and store said signal as a function of said ion selection voltage.

15. The ion energy analyzer of claim 14, wherein said ion energy analyzer is configured to rest upon a substrate holder in a plasma processing system, and wherein said substrate holder is coupled to a RF voltage at one or more RF frequencies and said ion energy analyzer floats at said RF voltage.

16. The ion energy analyzer of claim 15, further comprising:

a first RF filter disposed between said entrance grid and said measurement electronics system;

a second RF filter disposed between said electron rejection grid and said measurement electronics system; and a third RF filter disposed between said ion current collector and said measurement electronics system, wherein each of said first RF filter, said second RF filter, and said third RF filter comprise a high input impedance at said one or more RF frequencies.

17. The ion energy analyzer of claim 13, further comprising:

one or more dielectric members inserted between and configured to space apart each of said entrance grid, said electron rejection grid, and said ion current collector, wherein each of said one or more dielectric members comprises a plurality of openings extending there through to permit passage of said selected ion current to said ion current collector.

18. A method of measuring IED of plasma at one or more locations in a plasma processing system, comprising:

placing one or more ion energy analyzers at said one or more locations on a substrate holder in a plasma processing system; and measuring an IED at each of said one or more locations by performing the following:

exposing an entrance grid to said plasma at a DC self-bias potential, said entrance grid being exposed to the bulk plasma volume and located at an outermost plane of said one or more ion energy analyzers, wherein said entrance grid comprises a plurality of openings, and wherein a size of each of said plurality of openings is selected to be sub-Debye length or smaller for said plasma such that a plasma sheath at a boundary of said plasma at said outermost plane remains relatively unperturbed and said plasma sheath does not penetrate said entrance grid and extend into the ion energy analyzer;

biasing an electron rejection grid proximate to said entrance grid by a negative DC voltage to reject electrons from said plasma;

biasing an ion current collector proximate to said electron rejection grid by a positive DC voltage to discriminate between ions reaching said ion current collector;

measuring an ion current at said ion current collector using a current meter;

storing said ion current as a function of said positive DC voltage on said ion current collector; and varying said positive DC voltage on said ion current collector.

* * * * *